(12) United States Patent
Bergenek et al.

(10) Patent No.: US 10,655,791 B2
(45) Date of Patent: May 19, 2020

(54) LUMINOUS MEANS HAVING LEDS

(71) Applicant: LEDVANCE GmbH, Garching (DE)

(72) Inventors: Krister Bergenek, Regensburg (DE);
Florian Bosl, Regensburg (DE);
Andreas Dobner, Wenzenbach (DE);
Tobias Schmidt, Garching bei Munchen (DE); Andreas Kloss, Neubiberg (DE);
Frank Vollkommer, Gauting (DE)

(73) Assignee: LEDVANCE GMBH, Garching bei Munchen (DE)

(*) Notice: Subject to any disclaimer, the term of this patent is extended or adjusted under 35 U.S.C. 154(b) by 23 days.

(21) Appl. No.: 15/566,540

(22) PCT Filed: Mar. 2, 2016

(86) PCT No.: PCT/EP2016/054353
§ 371 (c)(1),
(2) Date: Oct. 13, 2017

(87) PCT Pub. No.: WO2016/165870
PCT Pub. Date: Oct. 20, 2016

(65) Prior Publication Data
US 2018/0100624 A1 Apr. 12, 2018

(30) Foreign Application Priority Data

Apr. 15, 2015 (DE) .................. 10 2015 206 808

(51) Int. Cl.
*F21V 21/00* (2006.01)
*F21K 9/232* (2016.01)
(Continued)

(52) U.S. Cl.
CPC ............. *F21K 9/232* (2016.08); *H05K 1/189* (2013.01); *F21Y 2107/00* (2016.08);
(Continued)

(58) Field of Classification Search
CPC ....... F21V 3/04–0625; F21V 5/00–048; G02B 19/0028; G02B 19/0047–0071
(Continued)

(56) References Cited

U.S. PATENT DOCUMENTS 8,596,821 B2 * 12/2013 Brandes ................ F21V 23/005
362/249.02

FOREIGN PATENT DOCUMENTS

CN 103974525 A 8/2014
DE 102013206342 A1 11/2013
(Continued)

*Primary Examiner* — Jason M Han
(74) *Attorney, Agent, or Firm* — Hayes Soloway PC

(57) ABSTRACT

The present disclosure relates to a luminous means having a cap and an outer bulb in which LEDs are arranged on a flat multilayer substrate which is constructed, at least in regions, from at least two substrate layers between two outside surfaces which are opposite one another, wherein the at least two substrate layers are formed from a flat substrate sheet which is laid back on itself, and wherein the LEDs are mounted on a side surface of the substrate sheet, which at least proportionally forms the two outside surfaces of the multilayer substrate in each case on account of the substrate sheet being laid back, in such a manner that at least one of the LEDs is mounted in each case on both of the two outside surfaces of the multilayer substrate.

7 Claims, 8 Drawing Sheets

(51) Int. Cl.
*H05K 1/18* (2006.01)
*F21Y 115/10* (2016.01)
*F21Y 107/00* (2016.01)
*H05K 1/02* (2006.01)

(52) U.S. Cl.
CPC ........... *F21Y 2115/10* (2016.08); *H05K 1/028* (2013.01); *H05K 2201/055* (2013.01); *H05K 2201/10106* (2013.01)

(58) Field of Classification Search
USPC ..................................... 362/249.02, 311.02
See application file for complete search history.

(56) References Cited

FOREIGN PATENT DOCUMENTS

| | | |
|---|---|---|
| DE | 102012218181 A1 | 4/2014 |
| EP | 1443562 A2 | 8/2004 |
| EP | 2392851 A1 | 12/2011 |
| WO | 2014013671 A1 | 1/2014 |
| WO | 2014024339 A1 | 2/2014 |
| WO | 2014087357 A1 | 6/2014 |
| WO | 2014184008 A1 | 11/2014 |

* cited by examiner

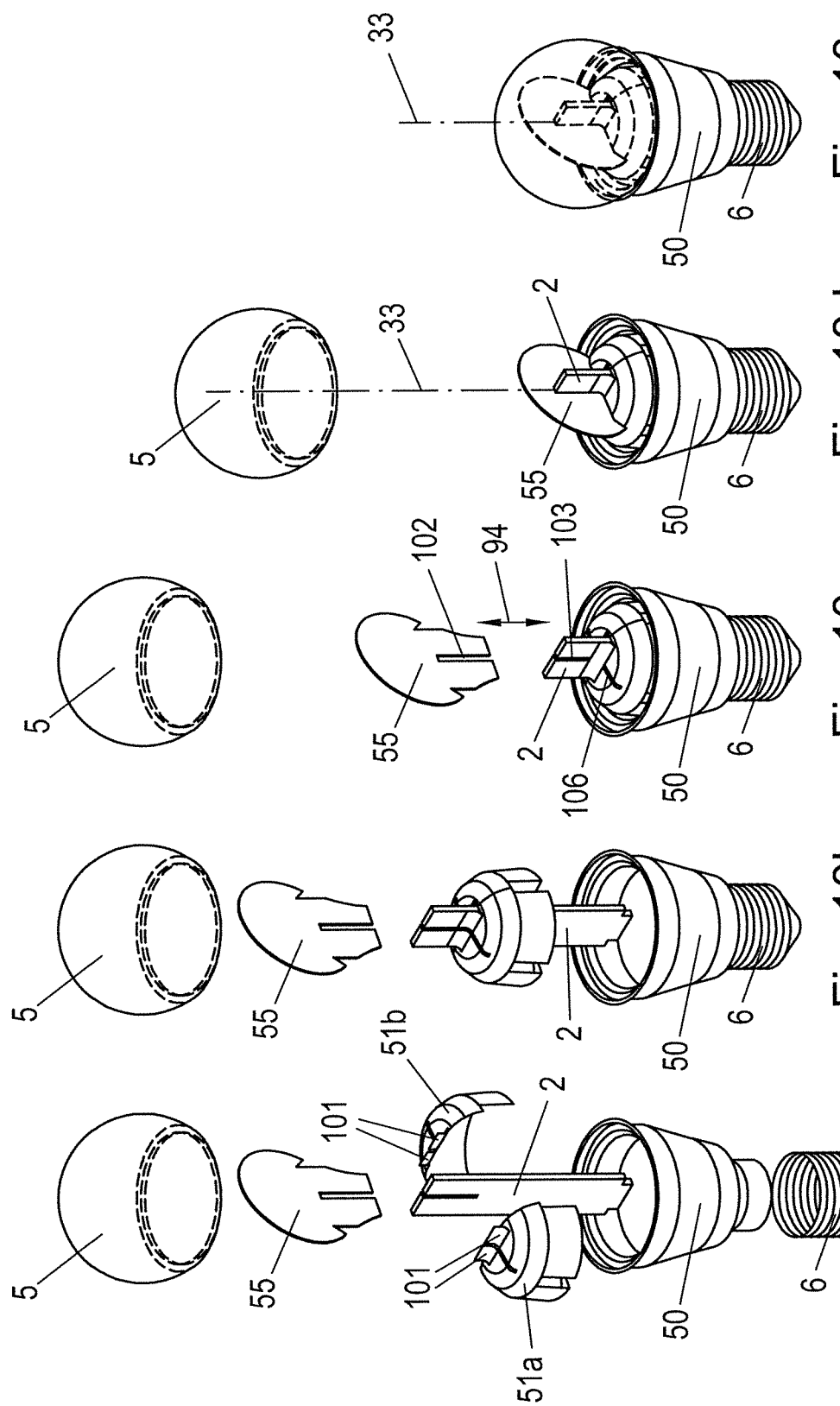

LUMINOUS MEANS HAVING LEDS

CROSS-REFERENCE TO RELATED APPLICATION AND PRIORITY

This patent application is a U.S. National Stage of International Patent Application No. PCT/EP2016/054353 filed on Mar. 2, 2016, which claims priority from German Patent Application No. 102015206808.0 filed on Apr. 15, 2015. Each of these patent applications is herein incorporated by reference in its entirety.

TECHNICAL FIELD

The present invention relates to a luminous means having LEDs mounted on a multilayer substrate, wherein the multilayer substrate having the LEDs is arranged in an outer bulb.

PRIOR ART

A conventional luminous means such as, for example, a filament bulb emits light with approximately unidirectional light distribution, thus, in simple terms, the same amount of light is emitted in all directions (except for shading by the base of the filament bulb, for example). An LED, on the other hand, emits light directionally, namely generally with Lambertian light distribution. The light intensity, or radiant intensity, is thus maximum, for example, along a surface normal to a radiating surface of the LED and decreases as the angle relative to the surface normal increases, no light reaches the rear space.

In order ultimately to generate homogeneous light distribution despite this directional light emission for each LED, there are known from the prior art, for example, luminous means in which the light emitted by an LED is redistributed by a lens, for example by a combination of light refraction and reflection (usually total reflection). In this manner it is possible to generate from the Lambertian light distribution of the LED mounted on a circuit board, for example, a light distribution in which the light, similarly to a filament bulb, fills a light volume which is greater than a half-space. Light is thus redistributed by the lens into the rear space.

PRESENTATION OF THE INVENTION

The technical problem underlying the present invention is to provide a luminous means that is advantageous over the prior art, and a method for the production thereof.

This object is achieved according to the invention with a luminous means having a plurality of LEDs for emitting light, a planar multilayer substrate which, between two mutually opposite lateral side surfaces, is composed at least in some regions of at least two substrate layers, on which multilayer substrate the LEDs are mounted and which carries a conductive track structure with which the LEDs are electrically conductively connected, an outer bulb which is transmissive for the light emitted by the LEDs and in which the multilayer substrate having the LEDs is arranged, and a base with which the LEDs are electrically operably connected via the conductive track structure, wherein the at least two substrate layers are formed from a planar substrate sheet which is laid back on itself, and wherein the LEDs are mounted on a side surface of the substrate sheet, which side surface, owing to the substrate sheet being laid back, forms at least part of each of the two outer side surfaces of the multilayer substrate, in such a manner that at least one of the LEDs is mounted on each of the two outer side surfaces of the multilayer substrate, and a method comprising the steps:
providing the planar substrate sheet;
mounting the LEDs on the side surface of the substrate sheet;
laying the substrate sheet with the LEDs mounted thereon back on itself to form the multilayer substrate, in such a manner that at least one of the LEDs is mounted on each of the two outer side surfaces.

Preferred embodiments will be found in the dependent claims and in the disclosure as a whole, a specific distinction not always being made in the presentation between device aspects and method or use aspects; in any case, the disclosure is implicitly to be read in respect of all claim categories.

A basic idea of the invention consists in providing a multilayer substrate which, although ultimately equipped with LEDs on both sides, can nevertheless be equipped on one side during production because of its construction from a substrate sheet that is laid back on itself. LEDs only have to be mounted on the side surface forming at least part of the outer side surfaces of the multilayer substrate, which can help to reduce the complexity and the outlay compared to equipping both sides. An opposite side surface of the substrate sheet is preferably free of LEDs, thus the substrate sheet is equipped with LEDs on only one side. The multilayer substrate formed therefrom is then nevertheless equipped on both sides.

Although it is also necessary in the prior art mentioned at the beginning (luminous means having a lens) to equip only one side of the circuit board with LEDs, the lens must additionally be provided for redistributing the light into the rear space. By contrast, with the present approach, that is to say by ultimately equipping both sides, it is possible, for example, to provide each of two mutually opposite directions predominantly with light; depending on the specific configuration, even more than two directions may be provided with light (see below in detail). The emission of light in different directions is thus to a certain extent already integrated into the multilayer substrate and the relative arrangement of the LEDs created therewith, which, for example compared to the prior art, can help to reduce the number of individual parts that are to be fitted (for example, a lens is not required). In particular in mass production, the outlay and rejects, for example, can thus be reduced.

The side surface of the substrate sheet equipped with LEDs can form both the mutually opposite outer side surfaces of the multilayer substrate in each case in their entirety (see, for example, FIG. 6) or in each case only part of one or both thereof (see, for example, FIG. 3). The outer side surfaces of the multilayer substrate are mutually opposite in relation to the thickness direction thereof. The planar multilayer substrate has a considerably greater extent in each of its surface directions, for example at least 10, 15 or 20 times greater (with increasing preference in that order), than in the thickness direction perpendicular thereto; where the thickness varies over the multilayer substrate, an average formed over the substrate is considered. The outer side surfaces extend in each case in the surface directions.

The multilayer substrate composed "at least in some regions" of at least two substrate layers ("multilayer") is, for example, multilayer over a proportion of its surface area of at least 10%, 20% or 30%, with increasing preference in that order, see FIG. 2 in conjunction with FIG. 3 for illustration; upper limits (independently thereof) may be, for example, at most 80% or 60%. The multilayer substrate can, however, also be of multilayer construction in its entirety, that is to say over its entire surface area, see FIG. 7 in conjunction with FIG. 6 for illustration. The multilayer substrate is preferably planar at least in the region that is composed in multilayer form from the substrate sheet, thus the outer side surfaces in that region each lie in a plane and the planes are spaced apart from one another by the thickness of the multilayer substrate.

In general, it is also possible to form more than two substrate layers from the substrate sheet, thus it can be laid back on itself several times. For example, by laying back the substrate sheet three times, a multilayer substrate composed at least in some regions of four substrate layers could be formed, wherein an LED-free part surface of the side surface otherwise equipped with LEDs would then be laid back on itself and located inside the multilayer substrate between two substrate layers. However, preferably exactly two substrate layers are formed from the substrate sheet, which can, however, be supplemented with further layers which were previously (before the multilayer substrate was produced) separate from the substrate sheet, for example a carrier described in detail below.

The substrate layers formed from the substrate sheet each correspond to a part region of the substrate sheet, these part regions following one another in the thickness direction (of the multilayer substrate) because of the substrate sheet being laid back on itself. The substrate layers formed from the substrate sheet, in relation to the thickness region, then either adjoin one another directly, for example, or adjoin another layer of the multilayer substrate, which should not include an air layer (but should be free thereof). The substrate layers are preferably integral with one another, which further preferably applies to the multilayer substrate as a whole; "integral" means not separable from one another without damage (without damage to one of the substrate layers or a part arranged therebetween in relation to the thickness direction), even apart from a connecting region of the substrate sheet between the substrate layers.

The LEDs "mounted" on the multilayer substrate are preferably soldered, at least some of the soldered connections at the same time establishing the electrical contact between the conductive track structure and the LED and serving to mechanically fix the LED (however, soldered connections that serve only for mechanical fixing/thermal connection can additionally be provided). Preferred LEDs are so-called SMD (surface mounted device) components, which are soldered in a reflow process. The luminous means can be electrically connected (from outside in use) via the base.

The LEDs are "electrically operably" connected to the base, that is to say to the connecting points thereof that serve for contacting from outside, preferably with the interposition of a driver electronics (between the connecting points of the base and the LEDs). The luminous means is preferably configured for operation at mains voltage (at least 100 volts), thus mains voltage can be applied to the base connecting points and is preferably adapted for operation of the LEDs by means of a driver electronics of the luminous means.

The luminous means is preferably designed as a filament bulb replacement; the base is preferably an Edison base, particularly preferably with the thread identifier E27. In general, the outer bulb can also be clear (transparent), but it is preferably frosted, thus, for example (when the luminous means is not emitting light), the multilayer substrate is visible through the outer bulb from outside at most as an outline, preferably not at all. The frosting can be achieved, for example, by scattering centers, in particular scattering particles, embedded in the material of the outer bulb, and/or by scattering centers arranged on the surface of the outer bulb, for example a surface roughening and/or surface coating. Preference is given to a coating on the inside, that is to say a coating on the inner wall surface facing the LEDs, which can provide protection against scratches, for example, in use.

The multilayer substrate having the LEDs is arranged in the outer bulb such that the majority of the light emitted by the LEDs passes through the outer bulb, that is to say passes from inside to outside and is usable in an application. "Majority" in this respect can mean, for example, at least 70%, preferably at least 80%, further preferably at least 90%; a possible upper limit may be, for example, at most 99.9%. The light emitted by the LEDs can be incident on the inside wall of the outer bulb directly and/or after prior reflection and then pass through the inside wall to the outside.

In general, the substrate sheet could also be made from a metal, for example aluminum. An insulating layer, for example an imide layer, would then be arranged between the substrate sheet and the conductive track structure. The substrate sheet is preferably made from a plastics material, preferably a polyester material, particularly preferably from polyethylene terephthalate (PET). The substrate sheet is preferably single-layer, that is to say monolithic in relation to its thickness direction; "monolithic" means free in its interior of material boundaries between different materials or materials of different manufacturing origins, apart from randomly distributed inclusions, for example particles for increasing the thermal conductivity and/or reflectivity.

In a preferred embodiment, the substrate sheet is laid back on itself about a fold line, thus it is folded back on itself. The fold line is a bend in the substrate sheet (when seen macroscopically, based on its dimensional scale), thus the radius of curvature of the connecting region between the substrate layers should be as small as possible, within the scope of what is technically possible, for example smaller than the thickness of the multilayer substrate. Although manual folding is generally also conceivable, the fold line is preferably introduced by machine. In general, however, it is not necessary to form a fold line in order to lay the substrate sheet back on itself; the connecting region can in principle also be designed with a radius of curvature of any size, for example the substrate sheet can be placed in the connecting region around a round pin.

The fold line that is preferably introduced runs straight over the substrate sheet, from one outside edge to the other. It is introduced in such a manner that at least one of the LEDs is arranged on each side thereof; the part surfaces of the side surface equipped with LEDs lying on either side of the fold line then each form at least part of one of the outer side surfaces, which are then correspondingly each provided with at least one LED.

In a preferred embodiment, the multilayer substrate has a joint connecting layer between the substrate layers formed from the substrate sheet, via which joint connecting layer the substrate layers are connected to one another by a material-based connection. Preference is given to an adhesive layer which holds the substrate layers together. The joint connecting layer is arranged between the substrate layers, in relation to the thickness direction of the multilayer substrate, and extends (in the surface directions) over, for example, at least 50%, preferably at least 75%, further preferably at least 90%, of a region in which the multilayer substrate is multilayer.

The joint connecting layer also holds the substrate layers together apart from the connecting region. Two substrate layers can be held together either by a single joint connecting layer, which both substrate layers then adjoin, or, in the case of a carrier between the substrate layers as described below, also by two joint connecting layers, in each case between the particular substrate layer and the carrier. The joint connecting layer holding the substrate layers together thus does not necessarily have to adjoin the two substrate layers directly.

In a preferred embodiment, the substrate sheet has a thickness of at least 150 µm, preferably at least 200 µm, particularly preferably at least 250 µm. Advantageous upper limits may be, for example, at most 500 µm, preferably at most 450 µm, further preferably at most 400 µm, particularly preferably at most 350 µm, whereby the upper and lower limits can expressly also be of interest independently of one another. For example in the case of the preferred plastics material, for example PET, the inventors have noted that, in the mentioned range, the substrate sheet on the one hand has good basic stability but on the other hand can easily be laid back, in particular folded, on itself, which applies in particular with the conductive track thickness disclosed below.

In a preferred embodiment, which can also be of interest independently of a concretization of the substrate thickness, the conductive tracks of the conductive track structure have a thickness of at least 20 µm, preferably at least 25 µm, further preferably at least 30 µm, particularly preferably at least 35 µm. Advantageous upper limits may be, for example, at most 100 µm, preferably at most 90 µm, further preferably at most 80 µm, particularly preferably at most 70 µm, whereby the upper and lower limit can again also be of interest independently of one another. The conductive track structure and the multilayer substrate are integral with one another, thus cannot be separated from one another without damage (without damaging part of the assembly).

Although in general the conductive tracks could also be arranged on a side surface of the substrate sheet opposite the side surface equipped with LEDs, and the LEDs could then be connected therewith via pressure contacts, for example, the conductive tracks are preferably arranged on the side surface equipped with LEDs, particularly preferably only on that side surface (thus the opposite side surface is free therefrom). The conductive tracks are preferably arranged on those part surfaces of the side surfaces equipped with LEDs that in each case form at least part of one of the outer side surfaces. The thickness of the conductive tracks is taken along the thickness direction of the multilayer substrate, on both outer side surfaces separately. Where the thickness varies, an average formed over the multilayer substrate is considered. The thickness of the substrate sheet is taken along the thickness direction thereof, likewise as an average where the thickness varies, preference being given to a constant thickness, which then corresponds to the thicknesses of the individual substrate layers formed therefrom.

In a preferred embodiment, the multilayer substrate has a carrier which is arranged at least in some regions between the substrate layers (in relation to the thickness direction of the remainder of the substrate); the carrier is part of the multilayer substrate. Although a grid, for example, is generally also conceivable as the carrier, preference is given to a planar carrier which is continuous (uninterrupted) in relation to its surface directions, for example a plate. The thickness thereof perpendicularly to the surface directions, which is generally taken as an average and is preferably constant, can be, for example, at least 0.5 mm, preferably at least 1 mm, further preferably at least 1.5 mm, particularly preferably at least 2 mm, possible upper limits (independently thereof) being, for example, at most 5 mm, 4 mm or 3 mm (with increasing preference in the order given).

The carrier has a higher bending stiffness than the substrate sheet itself, for example at least 2, 4, 6, 8 or 10 times higher. In principle, a rigid carrier can also be provided, although upper limits may be, for example, at most 1000 or 500 times the bending stiffness of the substrate sheet itself. The carrier is preferably made from metal, particularly preferably from aluminum, which, in addition to mechanical stabilization, can also help to improve the heat dissipation from the LEDs. In general, however, mechanical stabilization can also be achieved, for example, with a plastics carrier of corresponding stiffness.

The carrier is "planar", thus has a considerably larger extent, for example at least 15, 20 or 25 times larger (with increasing preference in the order given), in each of its surface directions than in the thickness direction perpendicular thereto (where the thickness varies, an average is considered). The carrier should extend, for example, over at least 60%, 70%, 80% or 90% of the surface of the region of the multilayer substrate that is composed in multilayer form from the substrate sheet. The carrier is preferably a part that is planar overall.

The substrate sheet and the carrier are integral with one another, that is to say cannot be separated from one another without damage (without damaging one of them or a layer between them). The carrier and the substrate sheet are preferably put together as previously separate parts, each of the substrate layers preferably being connected to the carrier by a material-based joint connection, preferably an adhesive bond, particularly preferably an extensive adhesive film. In a preferred multilayer substrate, the layer sequence is thus as follows: substrate layer, adhesive film, carrier, adhesive film, substrate layer. The substrate sheet can also be assembled with the carrier in a belt or roller process (reel to reel), for example.

In a preferred embodiment, the multilayer substrate is divided into at least two part regions, immediately adjacent part regions being connected to one another by a bridge region formed from the substrate sheet. Each of the part regions should occupy, for example, at least 5%, preferably at least 10%, of the total surface area of the multilayer substrate, possible upper limits are, for example, at most 80% or 60%. Preferred upper limits for the number of part regions of the multilayer substrate may be, for example, at most 15, preferably at most 10, part regions. In each of the part regions, the multilayer substrate is preferably planar.

Tilting relates to immediately adjacent part regions, thus next but one part regions can also have the same orientation again, see FIG. 3 for illustration. A surface normal to a part region should enclose, for example, an angle of at least 10°, preferably at least 20°, particularly preferably at least 30°, with a surface normal to a part region that is "tilted" relative thereto, possible upper limits being, for example, at most 170°, preferably at most 160°, particularly preferably at most 150°. Surface normals to the same outer side surface are thereby considered.

The bridge region between immediately adjacent part regions is formed from the substrate sheet, preferably from only one substrate layer, thus the substrate sheet in the bridge region is preferably not laid back on itself. The bridge region is preferably formed only with the substrate sheet. The part regions are preferably formed by folding the substrate sheet, a respective fold line preferably extends in a respective bridge region.

In a preferred embodiment, at least one of the LEDs, which in turn is arranged in one of the part regions, is associated with another of the part regions so that at least 10%, preferably at least 15%, particularly preferably at least 20%, of the light emitted by the LED incidents on the other part region and reflected thereby. In this respect, the multilayer substrate at the same time serves as a reflector. With the reflection, some of the light is redistributed, which can serve, for example, to homogenize the light distribution in the far field.

A main propagation direction of the light as emitted by the LED (LED main propagation direction) can be tilted relative to a main propagation direction of the reflected light, for example, by at least 20°, preferably at least 30°, particularly preferably at least 40°, whereby possible upper limits (independently thereof) may be, for example, at most 120°, preferably at most 110°, particularly preferably at most 100°. Preference can be given to diffuse reflection. The "main propagation direction" of the particular light is in each case considered to be the direction that is obtained as the average of all the direction vectors along which the particular light propagates, each direction vector being weighted in this averaging with the light intensity associated therewith (each direction in which the particular light propagates can be described as a vector, with which a light intensity can be associated).

In general, reflection can also take place, for example, at a reflective layer applied to the substrate sheet, preferably the substrate sheet itself is reflective, for example on account of embedded reflective particles. In general, the degree of reflection in the reflecting part region should be, for example, at least 80%, with increasing preference in this order at least 85%, 90% or 95% (averaged over the visible spectral range of 380 μm to 780 μm); an upper limit may be, for example, 99.9%.

In a preferred embodiment, a further planar substrate is provided in addition to the multilayer substrate, the mutually opposite outer side surfaces of which further substrate are each equipped with at least one LED. The further substrate is preferably likewise a multilayer substrate formed from the substrate sheet, and all details disclosed in respect of the first multilayer substrate are also to be disclosed in relation to the second multilayer substrate; in the following, reference is nevertheless made to the "further substrate". The multilayer substrate and the further substrate are "assembled", thus fitted together as previously separate parts. For that purpose, at least one of the substrates is provided with a slot which passes through it in the thickness direction and into which the other substrate is pushed.

Preferably, both substrates are each provided with a slot which passes through the respective substrate in the thickness direction. In each substrate, the respective slot extends in one of the surface directions from one outer edge to a point on the respective substrate. The slots each extend straight (in the slot direction), perpendicular to the respective thickness direction, and the substrates are then fitted into one another in the slot direction. The multilayer substrate (that is to say the first substrate) is then arranged in the slot in the further substrate, and vice versa. Preference is given to an arrangement such that the slot direction in each case extends parallel to an outer bulb longitudinal axis, which will be referred to below, the slots particularly preferably coincide therewith.

In a preferred embodiment, the multilayer substrate is slotted and the further substrate (which can itself also be slotted, see above) is pushed into that slot. The slot can preferably be arranged in a region of the multilayer substrate in which only a single substrate layer is formed from the substrate sheet, thus which is not multilayer.

On the other hand, it can also be preferred to arrange the slot in the multilayer region of the multilayer substrate formed from the substrate sheet; thus the slot then passes through the at least two substrate layers in the thickness direction. This can have advantages in terms of stability, for example.

In a preferred embodiment, the multilayer substrate and the further substrate extend obliquely to one another, preferably at a right angle to one another, at least in those regions in which the LEDs are arranged. As a result of this arrangement, the LED main propagation directions of one of the LEDs of the multilayer substrate and of one of the LEDs of the further substrate are tilted relative to one another by preferably at least 80°, particularly preferably at least 85°, and (independently thereof) by preferably at most 100°, further preferably at most 95°. Preferably, each of the LEDs can be associated with at least one such pair with one of the LEDs of the respective other substrate.

In an alternative embodiment to the substrates fitted together, the multilayer substrate is assembled with a reflector which is itself free of LEDs, thus on which no LEDs are provided. The reflector and/or the multilayer substrate is provided with a slot into which the respective other individual part (multilayer substrate or reflector) is pushed. Preferably, both the parts are slotted and the reflector is pushed into the multilayer substrate, and vice versa. With regard to the form of the slot, reference is made to the above disclosure relating to the slotted substrate, which is also to be disclosed for the reflector.

The reflector should have, for example, a reflectivity (averaged over the visible spectral range) of, with increasing preference in this order, at least 80%, 85%, 90% or 95%; an upper limit may be, for example, at most 99.9%. The reflector is preferably combined with a multilayer substrate which is planar overall, particularly preferably arranged at a right angle thereto (the reflector and the multilayer substrate intersect at a right angle). In each of the four quadrants so formed, preferably at least one of the LEDs is arranged on the multilayer substrate, in each case at least 20%, with increasing preference in this order at least 25%, 30%, 35% or 40%, of the total light emitted by that LED being incident on the reflector and being reflected thereby. The reflector distributes the light in the surface directions of the multilayer substrate which were originally scarcely provided or not provided at all.

The reflector is preferably a part which is planar overall and can generally also be made from metal, for example. Preference is given to a plastics material, which further preferably is optimized in terms of its reflectivity due to inclusions, preferably reflective particles, embedded therein. The reflector can be made of polybutylene terephthalate (PBT), for example.

In a preferred embodiment, the multilayer substrate having the LEDs is arranged in the outer bulb such that the LED main propagation directions enclose an angle of at least 80°, preferably at least 85°, and at most 100°, preferably at most 95°, with a longitudinal direction parallel to the outer bulb longitudinal axis and facing away from the base towards the outer bulb; particularly preferably, the LED main propagation directions are in each case perpendicular to the outer bulb longitudinal direction. The outer bulb longitudinal axis passes through the base; preferably, the outer bulb is radially symmetrical, particularly preferably rotationally symmetrical, about the longitudinal axis. At least two of the LEDs, preferably at least four of the LEDs, should be correspondingly arranged; it can also be preferred that all of the LEDs mounted on the multilayer substrate are correspondingly arranged.

In a preferred embodiment, at least one of the LEDs is arranged such that its LED main propagation direction encloses an angle of at most 10°, preferably at most 5°, further preferably at most 2.5°, with the outer bulb longitudinal direction, particularly preferably is parallel thereto (angle of 0°). The corresponding LED is thus arranged on a part region of the multilayer substrate which is correspondingly tilted relative to the remainder of the multilayer substrate. A surface normal to this part region, namely to the side surface on which the LED is arranged, is thus tilted by a correspondingly small amount relative to the outer bulb longitudinal direction (at most 10°, see the degrees indicated above for further preferred values). This part region is preferably planar.

A corresponding part region is preferably partially separated from the remainder of the substrate sheet by a parting line which passes through the substrate sheet in the thickness direction thereof, thus is still connected thereto via a bridge region. The partial region is then correspondingly tilted relative to the remainder of the multilayer substrate about the bridge region as a hinge.

In a preferred embodiment, the light distribution of the luminous means is homogenized in such a manner that the light intensity measured on a circular path around the outer bulb longitudinal axis (at an elevation angle of 90°, that is to say perpendicular to the outer bulb longitudinal direction) exhibits at most a slight variation. Any light intensity value taken on this circular path should thus represent at least 30%, preferably at least 25%, of a maximum value of the light intensity taken on the circular path. Preferably, the light intensity also exhibits a correspondingly small variation at other (but always constant for each circular path) elevation angles.

Preferably, in all directions which enclose an angle of between 0° and a critical angle with the outer bulb longitudinal direction (see above), a light intensity other than zero is still measured, which preferably represents at least 10%, further preferably at least 20% or 30% of a maximum light intensity. The critical angle is, with increasing preference, greater than 90°, 100°, 110°, 120°, 130°, 140°, 150° or 160°; at angles greater than 170°, the light intensity can be zero.

In the following, the unit consisting of the multilayer substrate and the conductive track structure is referred to as a "circuit board" for the sake of simplicity. A first of the LEDs is arranged on one side surface thereof and a second of the LEDs is arranged on the opposite side surface, preferably a third of the LEDs is arranged together with the first LED on the same side surface and a fourth of the LEDs is arranged together with the second of the LEDs on the same side surface. The details regarding the width/length refer to a multilayer substrate which is planar overall.

In a preferred embodiment, a cooling element is provided in direct thermal contact with the circuit board, which cooling element either itself forms an outer surface of the luminous means or is provided in direct thermal contact with part of the luminous means, preferably a housing part (see below) separate from the base, which forms an outer surface of the luminous means. The thermal resistance $R_{th}$ of the cooling element is dependent, for example, on the thermal conductivity of the cooling element material and on the connection thereof, but should be at most 25 K/W, whereby at most 20 K/W, 15 K/W, 10 K/W or 5 K/W are further upper limits of increasing preference in the order given. A thermal contact resistance between the circuit board and the cooling element should preferably be small, that is to say, for example, should represent at most 50%, 40%, 30%, 20% or 10% of the thermal resistance $R_{th}$ of the cooling element; the same is true for any thermal contact resistance to the part forming the outer surface of the luminous means (provided this does not itself form the outer surface).

The material of the cooling element is preferably a metal, for example aluminum, but it is also possible to provide, for example, a thermally conductive plastics material, that is to say, for example, a plastics material with particles embedded therein to increase the thermal conductivity.

"In direct thermal contact" means with at most a material-based connecting layer therebetween, for example a solder layer, preferably directly in contact with one another. Preferably, the cooling element is in contact (to the outside, for heat dissipation) with a housing part arranged between the base and the outer bulb, wherein the housing part and the cooling element are further preferably held together by an interference fit (press fit), that is to say the cooling element is pressed into the housing part. If a cooling element is provided, the outer bulb can be made of a plastics material, which can have cost advantages. The outer bulb also does not have to provide, for example, a closed gas volume (containing thermally conductive gas), which can help to reduce the outlay.

Thus, although the outer bulb does not have to hermetically seal the volume with the circuit board and the reflector therein by itself and together with the base and/or a housing part, it can at least be closed off to such an extent that the penetration of dust can be prevented. The thermal concept thus makes it unnecessary to provide, for example, ventilation slots and the like, which could otherwise allow the ingress of dirt. The outer bulb itself is preferably free of slots (connecting the inner and outer volumes).

In a preferred embodiment, the circuit board and the cooling element are in direct contact with one another and they have a contact surface with one another whose surface area is at least as large as a surface area of the two side surfaces of the circuit board that is equipped with LEDs. The base areas of the LEDs arranged on the circuit board are thus added together, and the contact surface between the cooling element and the circuit board should correspond at least to that total area. The contact surface is preferably divided into a plurality of part surfaces (which are each formed, for example, by a tongue, see below), which are spaced apart from one another, the part surfaces then further preferably being distributed equally over the side surfaces of the circuit board. The "base area" of an LED is taken at a perpendicular projection of the LED into a plane perpendicular to the thickness direction of the circuit board.

The contact surface which the circuit board and the cooling element have with one another should preferably represent, for example, with increasing preference in this order, at least 4 mm², 8 mm², 12 mm², 16 mm² or 20 mm². Possible upper limits (independently of the lower limits) are, for example, at most 80 mm² or 60 mm².

In a preferred embodiment, the cooling element is in direct contact at the mutually opposite side surfaces of the circuit board with in each case a tongue, preferably with in each case two tongues, further preferably in each case exactly two tongues. The circuit board is held by a friction-based connection between the tongues, which each form a part surface of the contact surface; a certain force is thus required in order to move the circuit board along the outer bulb longitudinal axis, the circuit board can be prevented by a friction-based connection, for example, at least from slipping out under the action of gravity (in the case of an outer bulb longitudinal axis that is parallel to the direction of gravity).

For each tongue, the particular part surface of the contact surface can have a surface area of, for example, with increasing preference in this order, at least 2 mm$^2$, 3 mm$^2$, 4 mm$^2$, 5 mm$^2$, 6 mm$^2$, 7 mm$^2$, 8 mm$^2$ or 9 mm$^2$. Possible upper limits (independently of the lower limits) may be, for example, at most 20 mm$^2$ or 15 mm$^2$.

For each tongue, it is preferred that a pressing region of the tongue forming the contact surface is closer to the LEDs than a deformation region of the tongue, the resilient deformation of which at least determines the majority of the pressing force. The tongue thus extends with the pressing region towards the LEDs and accordingly away from the base in the luminous means. The particular part surface (of the contact surface) can thus be arranged as close as possible to the LED, which helps to improve heat dissipation. In general, it can be preferred that at least the first and second LED (preferably also the third and fourth LED) have a smallest distance from their particular associated part surface of the contact surface of at most, with increasing preference in this order, 15 mm, 10 mm or 5 mm. Possible lower limits may be, for example, at least 0.5 mm or 1 mm.

In the case of a tongue having a pressing region extending towards the LEDs, the pressing region can also be followed (going from the deformation region to the pressing region) by a reflection region which rises away from the circuit board and on which some of the light emitted by the particular LED incidents and is reflected with a directional component along the outer bulb longitudinal axis. The proportion of the light incident thereon and being reflected thereby can be, for example, at least 5% or 10% (and, for example, at most 30% or 20%).

In a preferred embodiment, the cooling element is assembled from at least two parts, preference being given to exactly two parts, wherein the cooling element parts together enclose the circuit board, namely in relation to a circular path around the outer bulb longitudinal axis. "Assembled" means, for example, at most connected together by a friction-based, interlocking and/or material-based connection. Preferably, the cooling element parts are assembled on the circuit board in such a manner that, with the assembly of the cooling element, the cooling element is also already in position on the circuit board (thus as well as also arranged in the luminous means on the circuit board). Preferably, the cooling element parts are locked together, thus they are then held together in an interlocking manner. After assembly, the cooling element is preferably inserted, preferably pressed, into the housing part (see above), thus the cooling element is oversized relative to the housing part in order to be held therein with an interference fit.

The outer bulb is then fitted to the housing part, preferably seated in the form of a monolithic part having a movement along the outer bulb longitudinal axis. Preferably, the outer bulb is thereby pushed into the housing part to a certain extent and locked therewith.

Apart from the assembly of the cooling element parts around the circuit board, such a production method can, however, also be preferred in the case of a one-piece/monolithic cooling element. Such a cooling element can then also be held in the housing part by an interference fit, for example. In particular in the case of the monolithic cooling element (but generally also in the case of an assembled cooling element), the circuit board and the cooling element can generally also be connected together by a material-based connection, for example by a soldered or preferably welded connection.

In a preferred form of the cooling element assembled from cooling element parts, the cooling element and the circuit board are connected together in an interlocking manner, whereby the interlocking connection is intended to block a relative movement of the circuit board and the cooling element parallel to the outer bulb longitudinal axis. For that purpose there is preferably provided in the circuit board a groove which extends between the mutually opposite side surfaces thereof, preferably at an edge surface of the circuit board extending parallel to the outer bulb longitudinal axis, the edge surface is set back in the groove relative to the remainder of the edge surface. The assembled cooling element then engages into the groove and in this respect holds the circuit board in position.

In a preferred embodiment, the outer bulb and the housing part arranged between the base and the outer bulb adjoin one another at a circumferential (around the outer bulb longitudinal axis) line and the cooling element shades this boundary line from the LEDs, which prevents a direct light input, thus light falls from the LEDs onto the line without reflection. This can be perceived as more aesthetically pleasing when the luminous means is viewed from outside. Of course, the outer bulb and the housing part can also adjoin one another circumferentially at a surface; the "boundary line", when looking at the luminous means from outside, is considered to be the transition, visible at the outer surface of the luminous means, between the housing part and the outer bulb.

A housing part arranged between the base and the outer bulb and assembled (see the above disclosure relating to this term) with both is generally preferred, it being possible for the housing part, based on a total length of the luminous means taken along the outer bulb longitudinal axis (from the base end to the opposite outer bulb end), to extend over, for example, at least 10%, preferably at least 20%, of that total length; possible upper limits are, for example, at most 40% or 30%.

The luminous means can, however, generally also be designed without such a housing part, the outer bulb and the base then being assembled directly, that is to say adjoining one another (as in a conventional filament bulb). The driver electronics can then be accommodated in the base, for example. In order to be able to recreate a filament bulb shape with an outer bulb tapering towards the base, the outer bulb is in this case preferably assembled from two half-shells, which further preferably adjoin one another in a plane containing the outer bulb longitudinal axis.

Independently of this configuration (with/without a housing part) and the outer bulb specifically, the driver electronics for supplying the LEDs is in a preferred embodiment arranged with the LEDs on the same circuit board. Preferably, the luminous means has only a single circuit board, which already has cost advantages and can also help to reduce the outlay in terms of mounting. Because the luminous means is provided with a cooling element, it is not necessary, for example, for cooling purposes to evacuate the outer bulb and fill it with thermally conductive gas, but the outer bulb can instead be filled with air. Housed electronic components (driver electronics) can then be arranged in the same air volume, which would be disadvantageous in the case of a thermally conductive gas, for example due to outgassing of the molding compound.

In another preferred embodiment, a glass outer bulb is provided, and this glass outer bulb delimits a closed volume. The closed volume is preferably filled with a filling gas which has a higher thermal conductivity compared to air (the gas mixture of the earth's atmosphere at sea level). The filling gas can contain helium, for example, namely in a greater proportion than air, for example in a proportion of, with increasing preference in this order, at least 50 vol. %, 70 vol. %, 99 vol. %. The helium in the filling gas can be mixed, for example, with air and/or nitrogen and/or oxygen.

In a preferred embodiment, the circuit board having the LEDs is then arranged wholly within the filling gas volume delimited by the glass outer bulb, thus it does not extend through the outer bulb wall. Further preferably, it is also spaced apart from an inner wall surface of the outer bulb delimiting the filling gas volume, thus it is not in contact therewith.

In a further form of the circuit board arranged wholly within the filling gas volume, the circuit board is free of a driver electronics, thus preferably only the LEDs are arranged on the circuit board and are electrically conductively connected to the conductive track structure. The driver electronics nevertheless preferably integrated into the luminous means is then arranged, for example, in the base, for example on a second circuit board. By not providing a driver electronics within the filling gas volume (the filling gas volume is free thereof), it is possible to prevent, for example, contamination of the filling gas, which could damage the LEDs, for example. When designing the driver electronics, it is then not necessary to give separate consideration to whether, for example, components of the housing technology (for example the potting compound) outgas; thus expensive special components do not have to be used, which can help to optimize costs in particular in respect of mass production.

In general, the circuit board preferably has a width, taken in one of the surface directions, of at most 30 mm, with at most 25 mm being further preferred and at most 20 mm being particularly preferred. Possible lower limits may be, for example, at least 15 mm or 18 mm. In a surface direction perpendicular to the above-mentioned surface direction, the circuit board preferably has a length of at most 60 mm, with at most 55 mm being further preferred and at most 50 mm being particularly preferred. In the luminous means, the circuit board is preferably so oriented that its width is taken perpendicularly to the outer bulb longitudinal axis. The longitudinal extent of the circuit board is then parallel to the outer bulb longitudinal axis.

The mentioned upper limits are to be understood as meaning that the circuit board, in the case of the width, has a width over its entire length that is smaller than/equal to the upper limit. This preferably applies analogously to the lower limit and/or correspondingly to the upper/lower limit of the length. Although as large a circuit board as possible may generally be preferred for thermal reasons, for example, it can be advantageous to limit the width of the circuit board because the luminous means can thus be produced using manufacturing steps of a conventional filament bulb.

It is possible, for example, comparably to the manufacture of filament bulbs, to provide a glass bulb which tapers to an opening—instead of a lamp base with a glow filament there is then used, for example, a lamp base with a circuit board. The circuit board, which is limited in width, can thereby be introduced through the opening of reduced diameter (reduced owing to the taper). From the production point of view, compatibility with existing process steps or intermediate products is thus achieved.

The preferably frosted outer bulb is preferably coated on the inside for frosting (see above), further preferably with a scratch-resistant coating. In relation to the handling of the finished luminous means by a user, although the frosting coating is already protected by being arranged on the inner surface of the outer bulb, the provision of a scratch-resistant coating can advantageously prevent the coating from being damaged during assembly of the luminous means.

In the production context, "glass bulb" in the present case refers to a preliminary stage of the outer bulb which is characterized by the opening on one side, to which the glass bulb tapers. By closing the opening of the glass bulb, the outer bulb delimiting a closed volume is produced, the taper, that is to say the pear-shaped form, preferably remaining unchanged.

The glass bulb opening does not necessarily have to be closed in a single step. Preferably, the circuit board is held in a lamp base made of glass, which is placed at the opening and fused with the glass bulb. The lamp base thereby closes the opening, but preferably not yet completely; instead, it still provides a channel through which the inner volume of the glass bulb is accessible to compressed fluid. The filling gas is introduced into the inner volume of the glass bulb via the channel, and then the channel is closed, preferably by fusion of glass. Before the filling gas is introduced, the inner volume of the glass bulb is preferably at least partially evacuated via the channel.

Current leads, for example of wire, which are electrically conductively connected to the circuit board, preferably already pass through the lamp base of glass when it is positioned at the opening of the glass bulb, via which current leads the LEDs are thus electrically operable/contactable. After the lamp base has been fixed in place, and preferably also after the glass bulb has been closed, the base is then electrically conductively connected to the current leads and fitted to the outer bulb, for example connected thereto by a material-based connection, for example adhesively bonded.

As already mentioned at the beginning, the invention relates also to a production method. In this method, the substrate sheet with the LEDs mounted thereon is laid back, preferably folded back, on itself to form the multilayer substrate. For the rest, reference is made to the above comments, which are explicitly also to be disclosed in respect of the production.

In a preferred embodiment, the substrate sheet is provided with a metallization which is locally plastically deformed when the substrate sheet is laid back and thus stabilizes the substrate sheet in the configuration laid back on itself. This metallization can, for example, be the conductive tracks forming the conductive track structure, but on the other hand it can also be provided separately therefrom, thus not serve for the electrical contacting of the LEDs. In the last-mentioned case too, the metallization is preferably composed of the same layer as the conductive tracks, thus the metallization and the conductive tracks are applied in the same step.

In the preferred case of folding back, the metallization extends beyond the fold line and is locally plastically deformed in the region thereof.

BRIEF DESCRIPTION OF THE DRAWINGS

The invention will be explained in greater detail below by means of exemplary embodiments, wherein the individual features within the scope of the further independent claims can also be fundamental to the invention in a different combination and, as before, a specific distinction is not made between the different claim categories.

The drawings specifically show

FIG. 10 different steps in the production of the luminous means according to FIG. 5;

PREFERRED EMBODIMENT OF THE INVENTION

Figure 1:
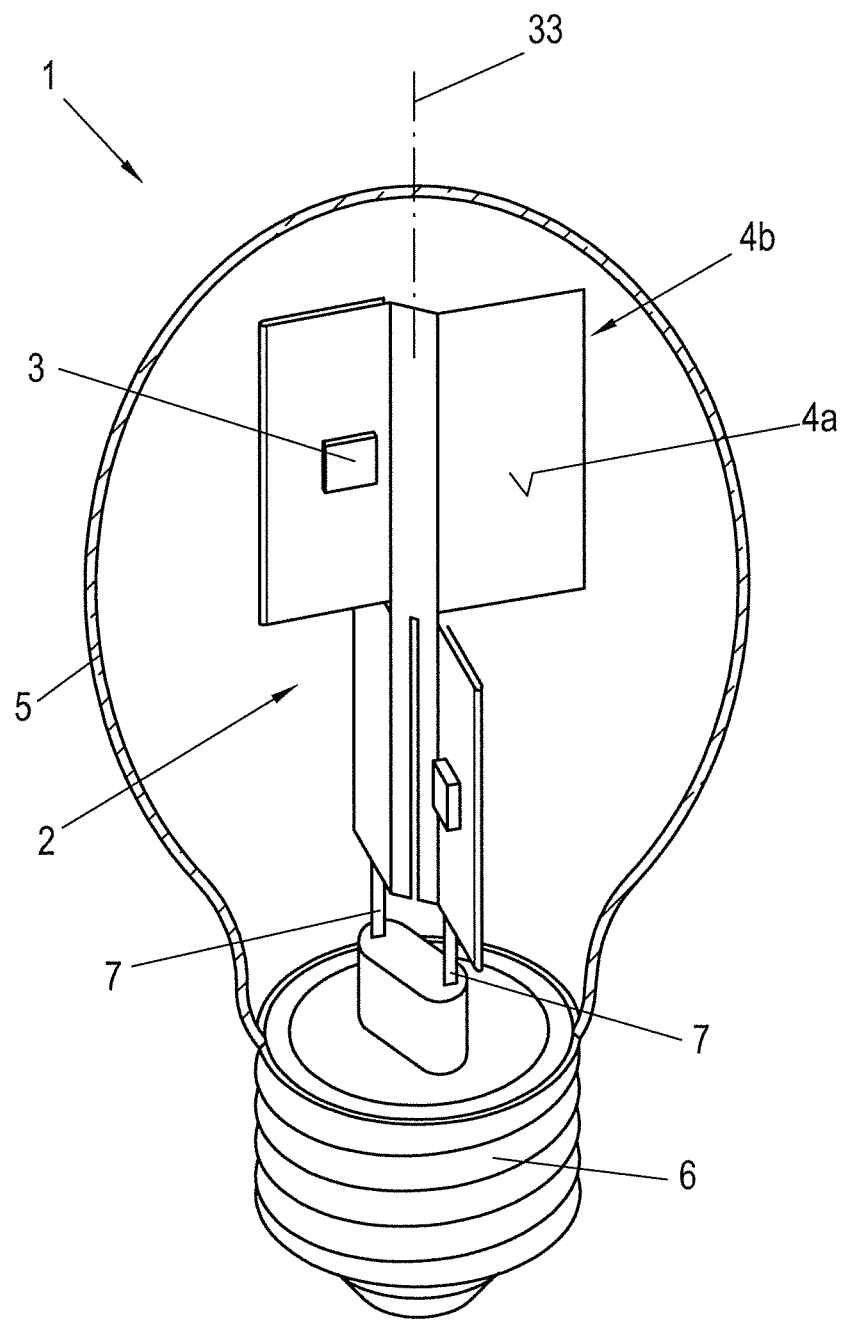
FIG. 1 a first luminous means according to the invention having a multilayer substrate.

FIG. 1 shows a luminous means 1 according to the invention in an oblique view. LEDs 3 are mounted on a multilayer substrate 2, namely on both outer side surfaces 4 of the multilayer substrate 2, of which only the front outer side surface 4a is visible due to the representation. The luminous means 1 is a replacement for a conventional filament bulb, the multilayer substrate 2 having the LEDs 3 is arranged in an outer bulb 5, which here is shown cut away and in reality is frosted. The outer bulb 5 is followed by a base 6 (E27 screw base), with which the LEDs 3 are electrically operably connected via two connecting wires 7 and a driver electronics (not visible) arranged in the base 6.

Figure 2:
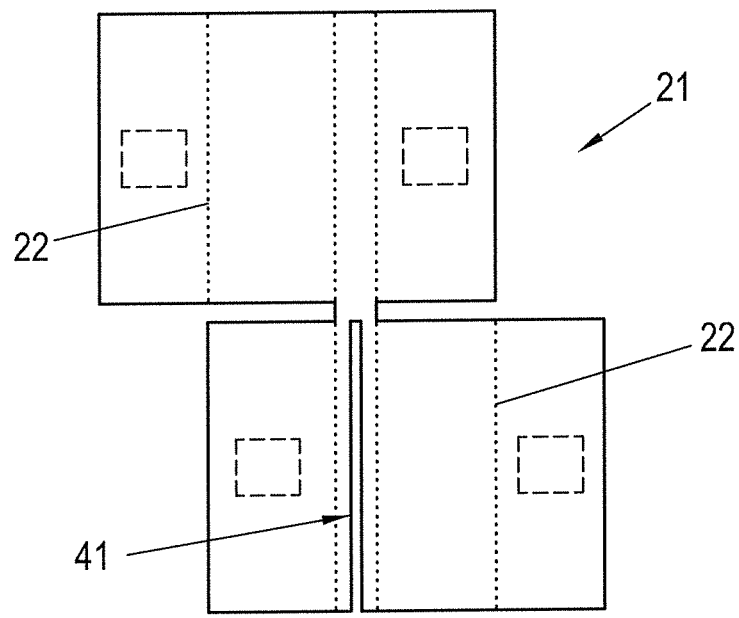
FIG. 2 a substrate sheet from which the multilayer substrate of the luminous means according to FIG. 1 is folded.

FIG. 2 shows a substrate sheet 21 of polyethylene terephthalate (PET) having a thickness (taken perpendicularly to the plane of the drawing) of 300 μm. The shape shown in FIG. 2 can be cut from a corresponding planar material, for example by stamping or laser cutting. Subsequently or also previously (still on the planar material), a copper layer (not shown) is applied to the substrate sheet, from which a conductive track structure is then cut. For that purpose, the copper layer can be masked with a photoresist, for example, which can then be exposed and locally opened; in a subsequent etching process, the regions arranged between the conductive tracks are exposed and are correspondingly removed, the conductive track structure remains.

The LEDs 3 are then mounted on the substrate sheet 21, namely in the present case four LEDs 3 in the regions marked by broken lines in FIG. 2. To form the multilayer substrate 2, the substrate sheet 21 is then folded back on itself twice, namely in each case about a fold line 22 shown by a dotted line in FIG. 2. Thereafter, two LEDs are arranged both on the visible front outer side surface 4a and on the opposite rear outer side surface 4b. The substrate layers formed from the substrate sheet 21 are connected together by a material-based connection by means of an adhesive layer, for which purpose the region folded back onto the remainder of the substrate sheet is in each case coated with an adhesive film (on the rear side, which is not visible in FIG. 2) before being folded back.

The multilayer substrate is then folded (not completely back on itself) a further four times in total and thus divided into a total of five part regions 2a-e. The part region 2e is LED-free; one of the LEDs is arranged in each of the remaining part regions 2a-d. Immediately adjacent part regions, for example the part region 2e and the part region 2c or the part region 2e and the part region 2a, are each connected together via a bridge region 31. The bridge regions 31 are each formed from the substrate sheet 21; the multilayer substrate 2 is single-layer in each of the bridge regions 31.

Owing to the arrangement of the LEDs 3 in the part regions 2a-d that are tilted relative to one another, the LED main propagation directions 32, in which the LEDs 3 each predominantly emit the light, are tilted relative to one another. Not only two mutually opposite directions are predominantly provided, but also two directions perpendicular thereto. This already produces a certain homogenization of the light distribution with respect to a circular path around a longitudinal axis 33 of the outer bulb 5 (see FIG. 1 for illustration).

A certain degree of further homogenization can be achieved with part region 2e, on which some of the light from two of the LEDs 3 incidents and is thus redistributed.

Figure 3:
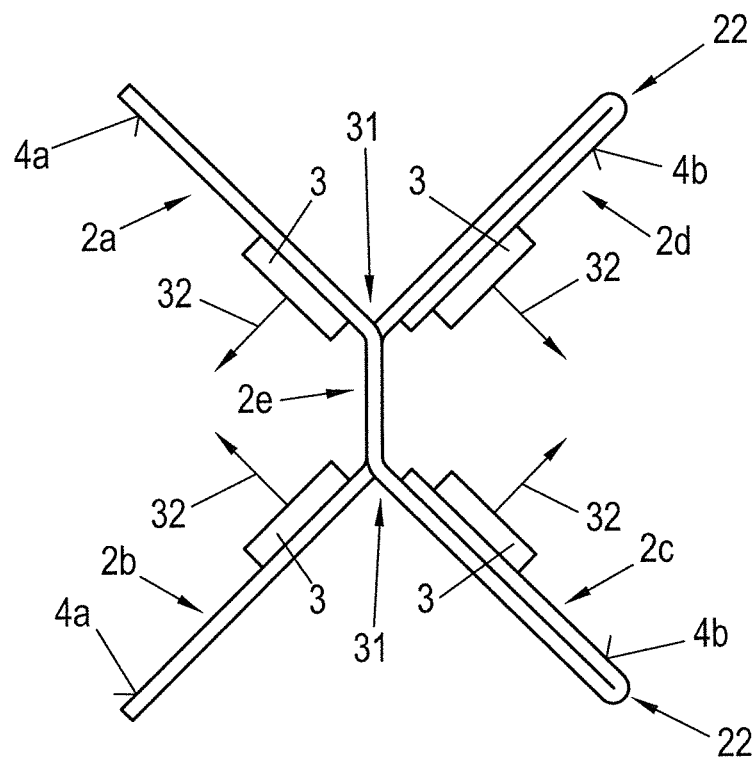
FIG. 3 a top view of the multilayer substrate of the luminous means according to FIG. 1, viewed along an outer bulb longitudinal axis.

Apart from the relative arrangement of the part regions 2a-e, it will further be seen in FIG. 3 how a substrate 2 that is multilayer in some regions is formed by folding the substrate sheet 21 back on itself. The substrate sheet 21 is folded back on itself about the fold lines 22 and as a result equipped with LEDs on both sides, that is to say on both mutually opposite outer side surfaces 4a, b.

Figure 4:
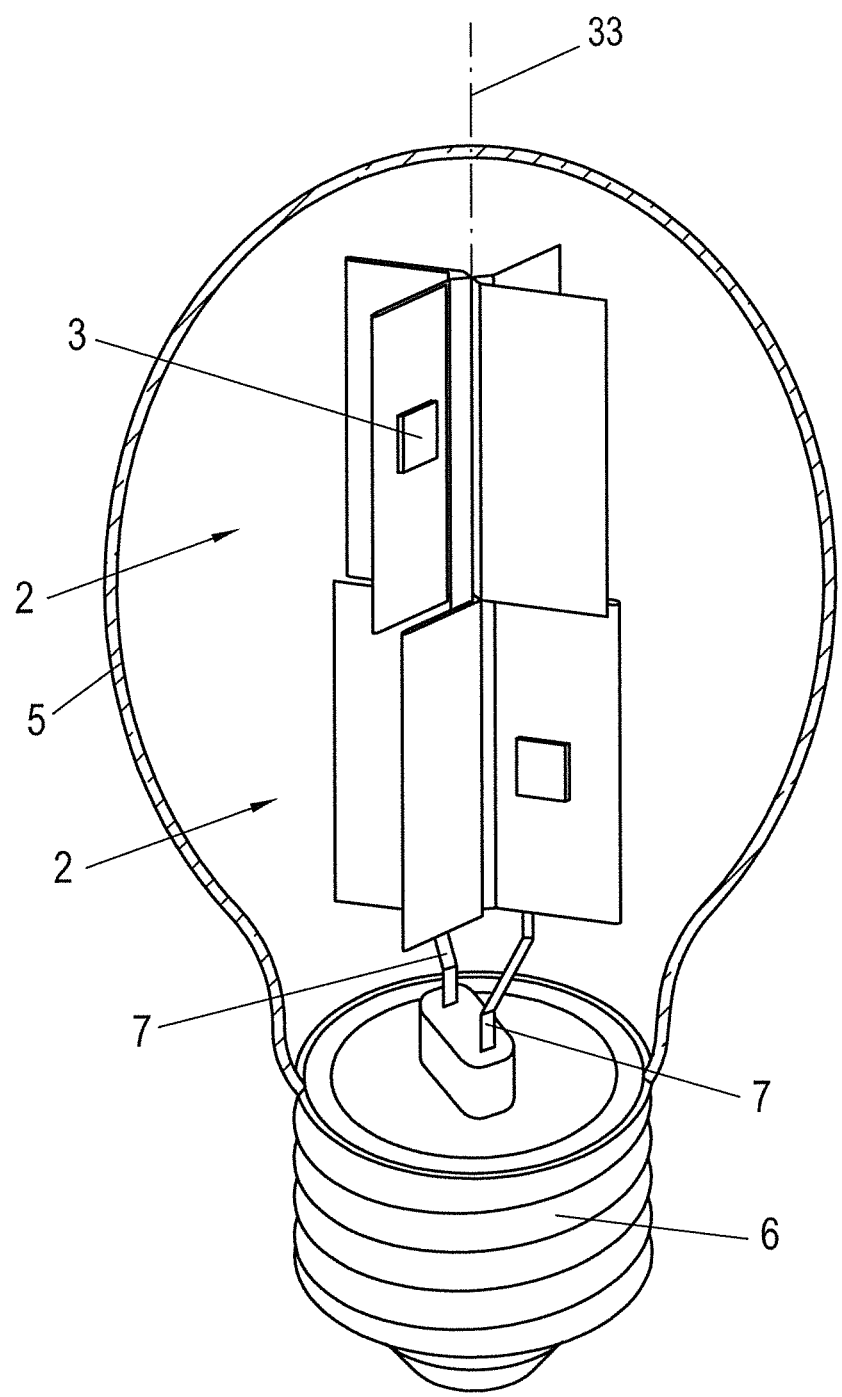
FIG. 4 a further luminous means according to the invention having two multilayer substrates fitted into one another, each folded from a substrate sheet according to FIG. 3.

FIG. 4 shows an arrangement with two such multilayer substrates 2, which are fitted into one another. For that purpose, each of the multilayer substrates 2 is provided with a slot 41, which is already accounted for in the shape of the substrate sheet 21, see FIG. 2. One multilayer substrate 2 is then pushed into the slot 41 of the other multilayer substrate 2, and vice versa.

Figure 5:
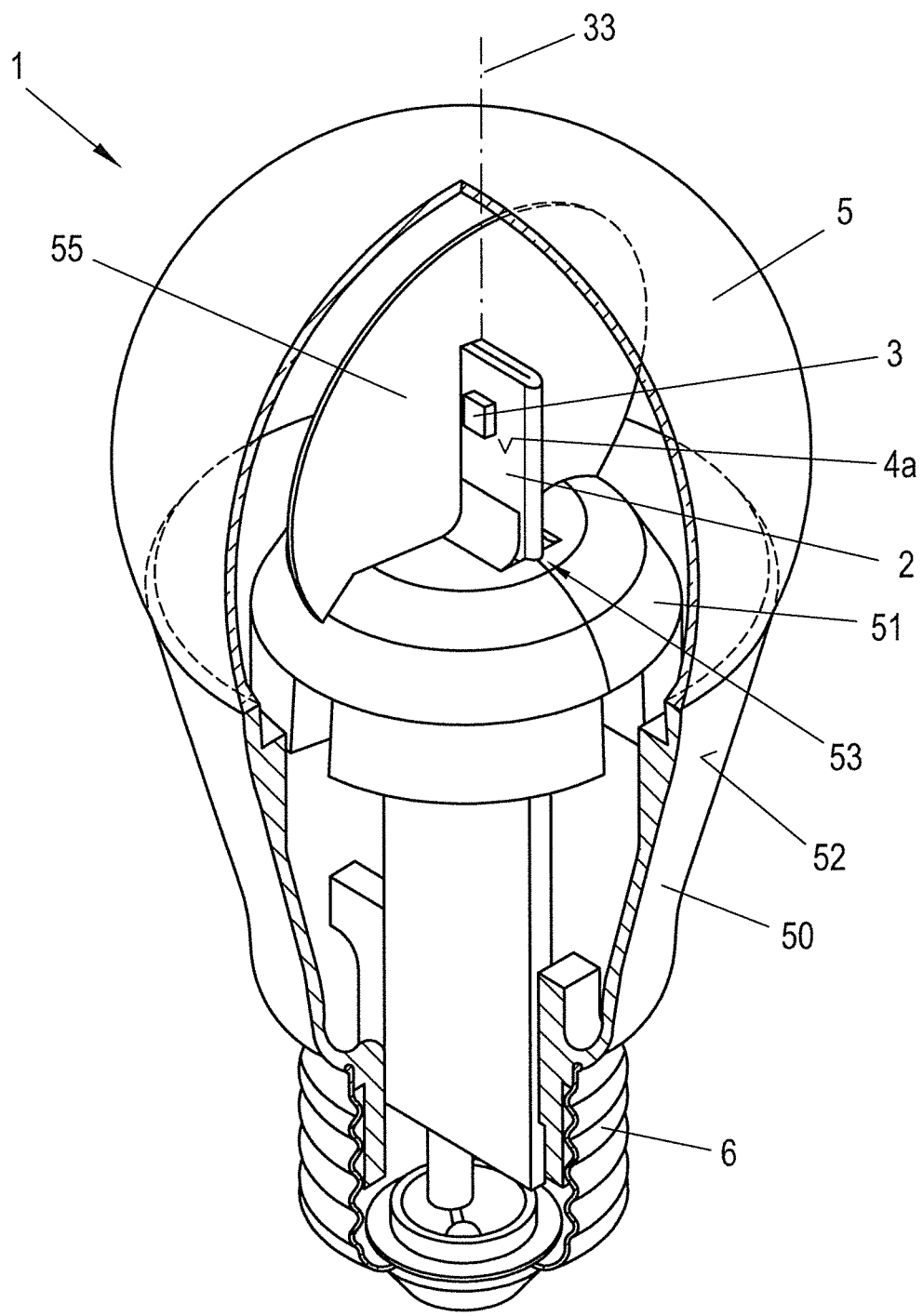
FIG. 5 a further luminous means according to the invention, wherein the multilayer substrate is assembled with a reflector.

FIG. 5 shows a further luminous means 1 according to the invention having a multilayer substrate 2 equipped with LEDs and arranged in an outer bulb 5, the LEDs 3 being electrically contactable via the base 6. In this case too, the base is an E27 base and the luminous means 1 is a replacement for a conventional filament bulb. The driver electronics is in this case arranged on the multilayer substrate 2 (but not shown).

The outer bulb 5 is made from plastics material. The outer bulb is shown clear here, but in reality it is frosted. Between the outer bulb 5 and the base 6 there is arranged a housing part 50. The outer bulb longitudinal axis 33 extends through the luminous means 1 and passes through the base 6 and the outer bulb 5. The luminous means 1 further has a cooling element 51 of aluminum, which serves to dissipate the heat generated by the LEDs 3. For that purpose, the cooling element 51 rests with four tongues 101 (see also FIG. 10) planar against the multilayer substrate 2. The cooling element 51 rests against the housing part 50, which forms an outer surface 52 of the luminous means 1. The cooling element 51 has a thermal resistance $R_{th}$ of about 5 K/W.

The multilayer substrate 2 of the luminous means 1 according to FIG. 5 is assembled with a reflector 55, which is pushed into a slot in the multilayer substrate 2 and is itself also slotted, so that the multilayer substrate 2 is also pushed to a certain extent into the reflector 55. The multilayer substrate 2 is in this case planar overall, so that the LEDs 3 arranged on the two mutually opposite outer side surfaces 4 emit light predominantly in two mutually opposite directions, but the surface directions of the multilayer substrate 2 are scarcely provided or not provided at all.

Figure 6:
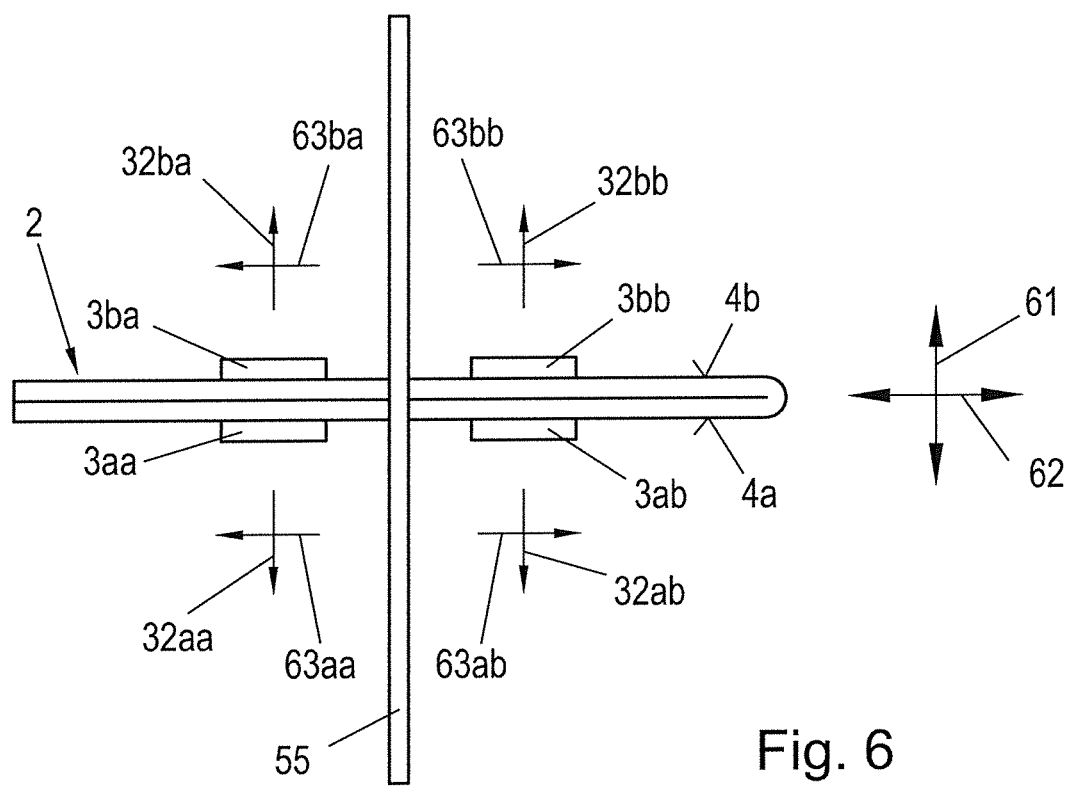
FIG. 6 a top view of the multilayer substrate and the reflector according to FIG. 5, viewed along an outer bulb longitudinal axis.

The top view according to FIG. 6 illustrates the arrangement of the multilayer substrate 2 and the reflector 55 in a cross shape and in particular also the relative arrangement of the LEDs 3. A first 3aa and third LED 3ab are arranged on the same side surface 4a of the multilayer substrate 2; a second 3ba and fourth LED 3bb are arranged on the opposite side surface 4b. Each of the LEDs 3 emits light with a particular LED main propagation direction 32. The LED main propagation directions 32aa, 32ab of the first 3aa and third LED 3ab are parallel to one another and opposite to the LED main propagation directions 32ba, 32bb of the second 3ba and fourth LED 3bb.

However, with the mutually opposite LED main propagation directions 32, light would be given off predominantly upwards and downwards in the representation according to FIG. 6, but the left and right side would be underprovided. In a reference system of the multilayer substrate 2, a thickness direction 61 would thus preferentially be provided, while the surface directions 62 remained underprovided or not provided at all. In order to redistribute light in the surface directions 62, the reflector 55 is therefore provided, which reflector is in the form of a monolithic plastics part, for example made of polybutylene terephthalate (PBT); on account of reflective particles embedded in the plastics material, the reflector has a degree of reflection of about 90% to 98%.

Some of the light from each of the LEDs 3 is then incident on the reflector 55 and is reflected thereby, namely in each case an amount of about 40%. The reflector 55 reflects the light diffusely, for which reason a particular main propagation direction 63 of the particular reflected light is then approximately at a right angle to the particular LED main propagation direction 32. The reflected light is thus distributed predominantly in the surface directions 62, which originally are scarcely provided or not provided at all.

Figure 7:
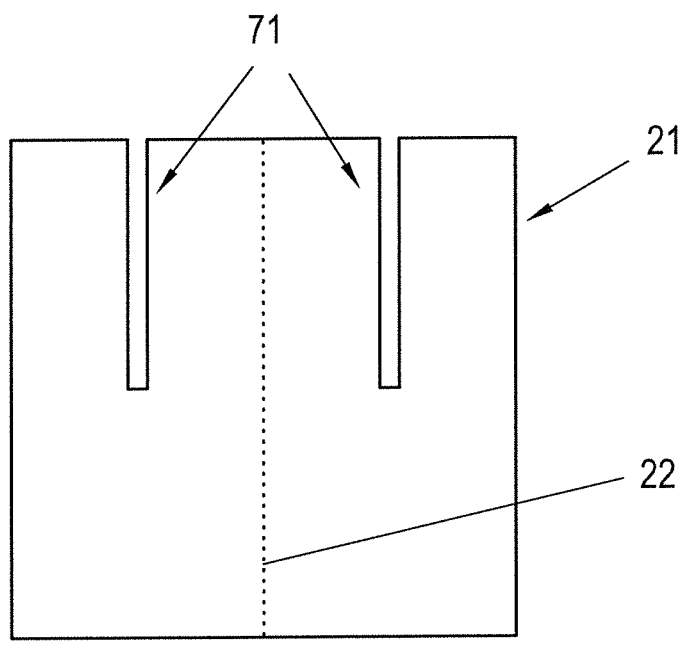
FIG. 7 a substrate sheet from which the multilayer substrate according to FIGS. 5 and 6 is folded.

FIG. 7 shows the substrate sheet 21 from which the multilayer substrate 2 according to FIGS. 5 and 6 is folded. In this case, the folded multilayer substrate 2 is multilayer overall, thus the substrate layers each extend over the entire multilayer substrate 2. The substrate sheet 21 is substantially square, and a rectangular multilayer substrate 2 is formed therefrom by folding the sheet back on itself about the fold line 22 indicated by a dotted line. With regard to the properties of the substrate sheet 21 and the conductive tracks arranged thereon, reference is made expressly to the above description relating to FIG. 2. In general, within the context of this disclosure, the same reference numerals denote parts having the same function, and in this respect reference is also made in each case to the description relating to the other figures.

The substrate sheet 21 is provided with two slots 71, which are made to coincide by folding back. The reflector 55 can then be pushed into the resulting slot.

Figure 8:
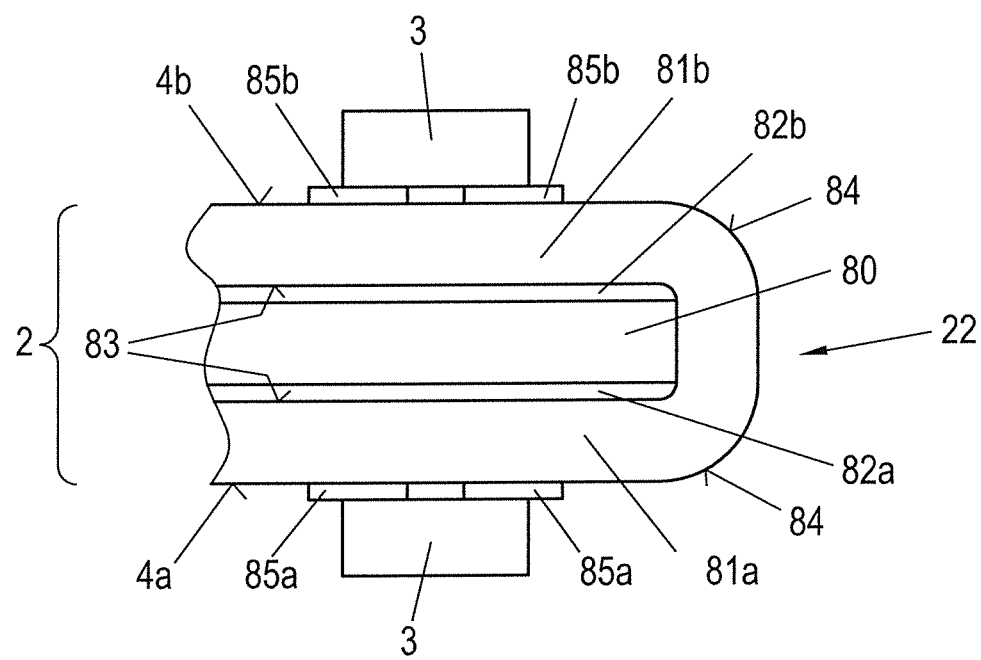
FIG. 8 a multilayer substrate having a carrier folded from the substrate sheet according to FIG. 7, in a schematic section.

FIG. 8 shows a further multilayer substrate 2 folded from the substrate sheet 21 according to FIG. 7. The multilayer substrate 2 according to FIG. 8 has a carrier 80, namely an aluminum plate. This serves both to mechanically stabilize the substrate layers 81 formed from the substrate sheet 21 and to improve heat dissipation from the LEDs 3. Furthermore, two joint connecting layers 82 can be seen in this schematic section, namely on both sides of the carrier 80. By means of each of the joint connecting layers 82, in each case one of the substrate layers 81 is connected by a material-based connection to the carrier 80 and thus also to the remainder of the multilayer substrate 2.

For production, an adhesive film can be applied to a side surface 83 of the substrate sheet 21 which is opposite the side surface 84 forming the outer side surfaces 4 of the multilayer substrate 2. The substrate sheet 21 is then folded around the carrier 80 and thus back on itself. The LEDs 3 are thereby already mounted on the substrate sheet 21 and each electrically conductively connected to conductor tracks 85a,b arranged on the side surface 84 thereof (for example via a low-temperature solder or a conductive adhesive).

Figure 9:
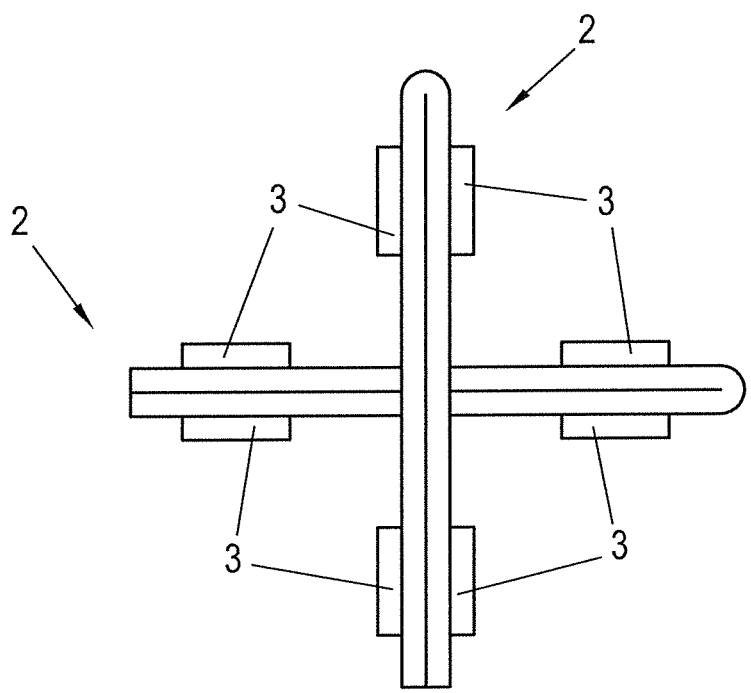
FIG. 9 a top view of two multilayer substrates according to FIG. 7 fitted into one another, viewed along the outer bulb longitudinal axis.

FIG. 9 shows two multilayer substrates 2 each folded from a substrate sheet 21 according to FIG. 7, which substrates are fitted into one another. One multilayer substrate 2 is thus fitted into the slot of the other multilayer substrate 2, and vice versa. In contrast to the arrangement according to FIG. 6, a second multilayer substrate 2 is provided instead of a reflector 55. By arranging the multilayer substrates 2 at a right angle to one another, four directions are already predominantly provided.

FIG. 10 illustrates the assembly of the luminous means 1 according to FIG. 5 in several steps. Initially, the outer bulb 5, the reflector 55 and the multilayer substrate 2 are separate parts. Furthermore, the cooling element 51 is also made from two cooling element parts 51a, b which are initially separate (FIG. 10a). In a first step, the two cooling element parts 51a, b are fitted to the multilayer substrate 2, thus the cooling element 51 is assembled in its position on the multilayer substrate 2 (FIG. 10b).

With the assembly of the cooling element 51, tongues 101 provided on the cooling element 51 are applied to the multilayer substrate 2. Furthermore, the multilayer substrate 2 is provided with a groove 53 (see FIG. 5 in detail), into which the cooling element 51 engages. The multilayer substrate 2 and the cooling element 51 are thus fixed in their relative position in relation to the outer bulb longitudinal axis 33.

The housing part 50 and the base 6 are initially also separate parts, which are assembled (FIG. 10b). In a next step, the unit consisting of the multilayer substrate 2 with the cooling element 51 is pressed into the housing part 50 (along the outer bulb longitudinal axis 33) and is then held therein by an interference fit (FIG. 10c).

The reflector 55 and the multilayer substrate 2 are then assembled, for which purpose a slot 102 is provided in the reflector 55 and a slot 103 is also provided in the multilayer substrate 2. The multilayer substrate 2 and the reflector 55 are fitted together in the slot direction 104 (FIG. 10c/d), a slot 106 to accommodate the reflector 55 also being provided in the cooling element 51.

In a final step (FIG. 10d), the outer bulb 5 is fitted, namely inserted to a certain extent into the housing part 50, with a movement along the outer bulb longitudinal axis 33. The outer bulb 5 is then held in an interlocking manner in the housing part 50.

Figure 11:
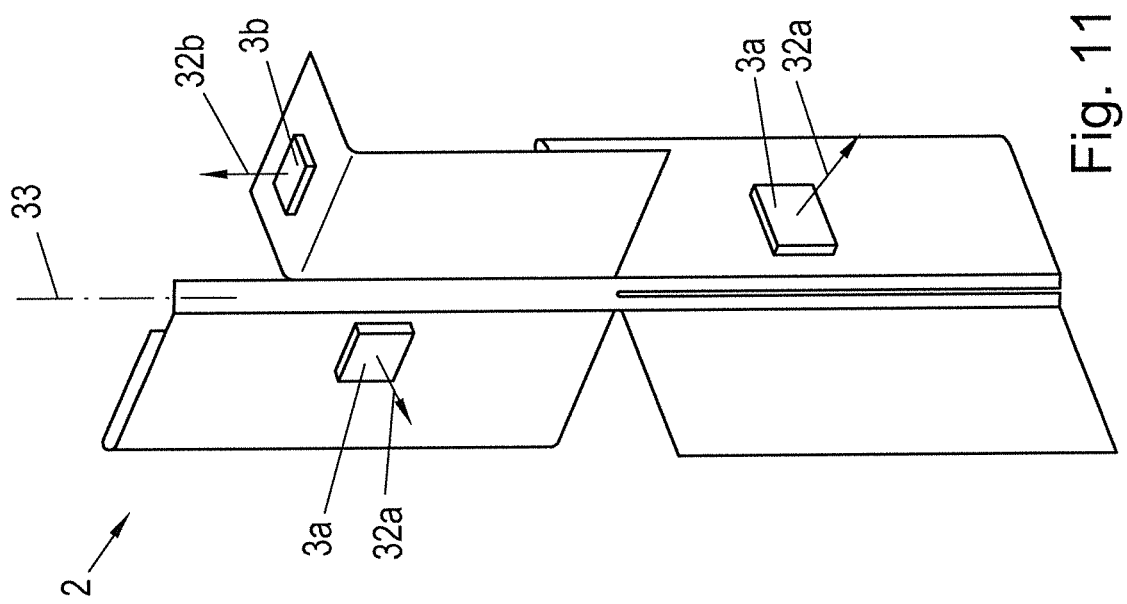
FIG. 11 a further multilayer substrate for a luminous means according to the invention, wherein one of the LEDs is oriented along the outer bulb longitudinal axis.

FIG. 11 shows a further multilayer substrate 2, which largely corresponds to the multilayer substrates 2 described with reference to FIGS. 1 and 3. The LEDs 3a are accordingly each oriented with their respective LED main propagation direction 32a perpendicular to the outer bulb longitudinal direction. For the rest, reference is made to the above description.

The multilayer substrate 2 according to FIG. 11 is additionally provided with a further LED 3b whose LED main propagation direction 32b is parallel to the outer bulb longitudinal direction. The outer bulb longitudinal direction is parallel to the outer bulb longitudinal axis 33 and points upwards in FIG. 11. With the correspondingly oriented LED 3b, directions around the outer bulb longitudinal axis 33 are predominantly provided.

Figure 12:
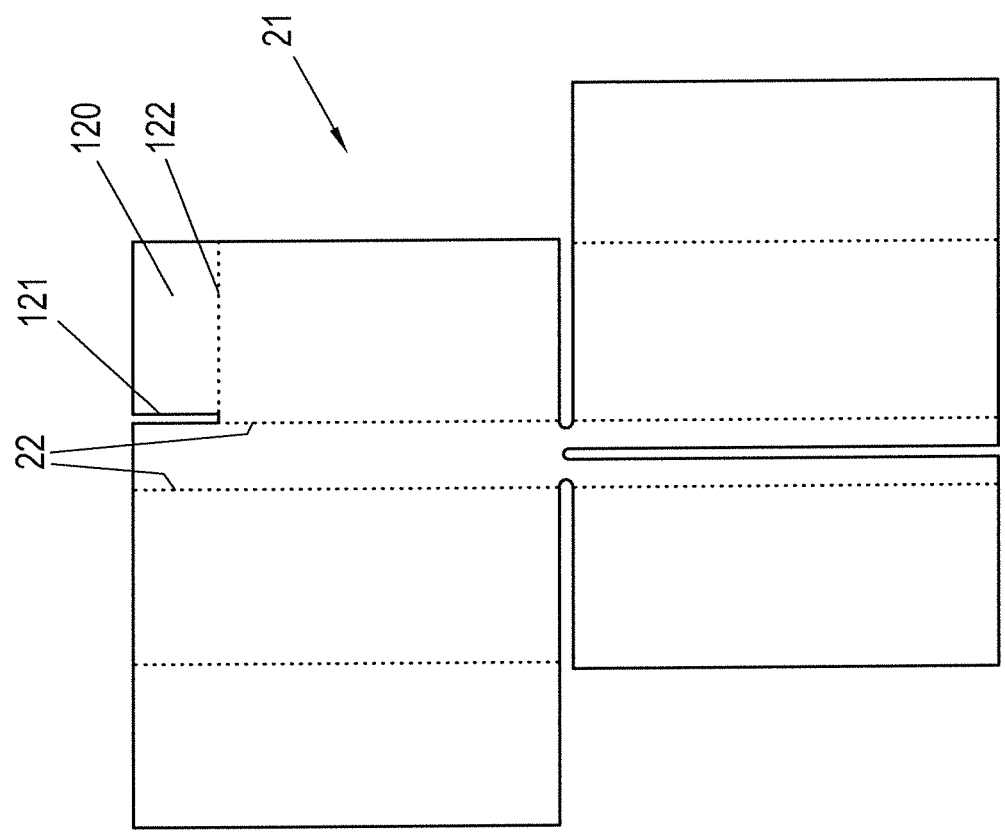
FIG. 12 the substrate sheet for the multilayer substrate according to FIG. 11.

FIG. 12 shows the substrate sheet 21 from which the multilayer substrate 2 according to FIG. 11 is folded. In this respect too, reference is made to the above description, in particular relating to FIG. 2. In addition, a part region 120 is partially separated from the remainder of the substrate sheet 21 by a parting line 121, that is to say still connected thereto via a bridge region 122. The LED 3b is arranged on this part region 120, the part region 120 is folded about the bridge region 122 as a hinge, backwards by 90° in the figure. The bridge region 122 thus then coincides with a fold line.

The invention claimed is:

1. A luminous means comprising:
a plurality of light-emitting diodes (LEDs) for emitting light;
a planar multilayer substrate which, between two mutually opposite outer side surfaces, is composed at least in some regions of at least two substrate layers, on which multilayer substrate the LEDs are mounted and which multilayer substrate carries a conductive track structure with which the LEDs are electrically conductively connected;
an outer bulb which is transmissive for the light emitted by the LEDs and in which the multilayer substrate having the LEDs is arranged; and
a base with which the LEDs are electrically operably connected via the conductive track structure;
wherein the at least two substrate layers are formed from a planar substrate sheet which is laid back on itself;
wherein the LEDs are mounted on a side surface of the substrate sheet, which side surface, owing to the substrate sheet being laid back, forms at least part of each of the two outer side surfaces of the multilayer substrate in such a manner that at least one of the LEDs is mounted on each of the two outer side surfaces of the multilayer substrate;
wherein the multilayer substrate is divided into at least two part regions, which part regions immediately adjacent to one another are tilted relative to one another and are connected together via a bridge region formed from the substrate sheet; and
wherein at least one of the LEDs, which itself is arranged in one of the part regions, is associated with another of the part regions in such a manner that at least 10% of the light emitted by the at least one LED incidents on the other part region and is reflected thereby.

2. A method for producing a luminous means according to claim 1, the method comprising:
providing the planar substrate sheet;
mounting the LEDs on the side surface of the substrate sheet; and
laying the substrate sheet with the LEDs mounted thereon back on itself to form the multilayer substrate in such a manner that at least one of the LEDs is mounted on each of the two outer side surfaces.

3. A luminous means comprising:
a plurality of light-emitting diodes (LEDs) for emitting light;
a planar multilayer substrate which, between two mutually opposite outer side surfaces, is composed at least in some regions of at least two substrate layers, on which multilayer substrate the LEDs are mounted and which multilayer substrate carries a conductive track structure with which the LEDs are electrically conductively connected;
an outer bulb which is transmissive for the light emitted by the LEDs and in which the multilayer substrate having the LEDs is arranged; and
a base with which the LEDs are electrically operably connected via the conductive track structure;
wherein the at least two substrate layers are formed from a planar substrate sheet which is laid back on itself;
wherein the LEDs are mounted on a side surface of the substrate sheet, which side surface, owing to the substrate sheet being laid back, forms at least part of each of the two outer side surfaces of the multilayer substrate in such a manner that at least one of the LEDs is mounted on each of the two outer side surfaces of the multilayer substrate; and
wherein the outer bulb is made from glass and delimits a closed volume filled with a filling gas, which filling gas has a higher thermal conductivity than air.

4. The luminous means according to claim 3, in which the multilayer substrate is arranged wholly within the filling gas volume and is free from driver electronics.

5. A method for producing a luminous means according to claim 3, the method comprising:
providing the planar substrate sheet;
mounting the LEDs on the side surface of the substrate sheet; and
laying the substrate sheet with the LEDs mounted thereon back on itself to form the multilayer substrate in such a manner that at least one of the LEDs is mounted on each of the two outer side surfaces.

6. The method according to claim 5 for producing a luminous means, in which a metallization is provided on the substrate sheet at least in some regions, which metallization is locally plastically deformed when the substrate sheet is laid back on itself.

7. The method according to claim 2 for producing a luminous means, in which a metallization is provided on the substrate sheet at least in some regions, which metallization is locally plastically deformed when the substrate sheet is laid back on itself.

* * * * *